United States Patent
Schmachtenberg, III et al.

(10) Patent No.: US 7,645,942 B2
(45) Date of Patent: Jan. 12, 2010

(54) ELECTRICAL INTERCONNECT WITH MAXIMIZED ELECTRICAL CONTACT

(75) Inventors: Richard Schmachtenberg, III, Aloha, OR (US); John R. Andrews, Fairport, NY (US); Bradley J. Gerner, Rochester, NY (US); Jonathan R. Brick, Tualatin, OR (US); Samuel Schultz, Wilsonville, OR (US); Chad J. Slenes, Sherwood, OR (US)

(73) Assignee: Xerox Corporation, Norwalk, CT (US)

( * ) Notice: Subject to any disclaimer, the term of this patent is extended or adjusted under 35 U.S.C. 154(b) by 486 days.

(21) Appl. No.: 11/298,421

(22) Filed: Dec. 9, 2005

(65) Prior Publication Data

US 2007/0131451 A1 Jun. 14, 2007

(51) Int. Cl.
*H05K 1/02* (2006.01)
(52) U.S. Cl. ....................... 174/259; 174/262
(58) Field of Classification Search ............... 174/259, 174/262–266
See application file for complete search history.

(56) References Cited

U.S. PATENT DOCUMENTS

| 6,037,547 | A | * | 3/2000 | Blish, II | 174/264 |
| 6,229,116 | B1 | | 5/2001 | Shirakawa et al. | |
| 7,186,925 | B2 | * | 3/2007 | Tsukahara et al. | 174/260 |
| 2004/0165362 | A1 | * | 8/2004 | Farnworth | 361/764 |
| 2005/0245066 | A1 | * | 11/2005 | Mis | 438/618 |

* cited by examiner

*Primary Examiner*—Jeremy C Norris
(74) *Attorney, Agent, or Firm*—Marger Johnson & McCollom, P.C.

(57) ABSTRACT

An electrical interconnect has an adhesive layer in which is formed an array of apertures, the apertures being of non-circular shape. An electrical circuit apparatus has a first circuit having at least one electrical contact, a second circuit having at least one electrical contact aligned to the electrical contact of the first circuit, and a standoff structure between the first and second circuits having at least one aperture aligned to one electrical contact of the first and second circuits, the aperture being of a non-circular shape.

6 Claims, 4 Drawing Sheets

ELECTRICAL INTERCONNECT WITH MAXIMIZED ELECTRICAL CONTACT

BACKGROUND

High density electrical interconnects pose many challenges. The interconnect must be able to achieve a high yield of parts having 100% of the connections with electrical continuity and without any shorts. The long term reliability, where shorts or opens do not develop over time or with thermal cycling or mechanical disturbances, is critical. The interconnect must satisfy significant geometrical constraints. Finally, assembly of the interconnect should be an efficient process. Generally, the more surface area available with which to make a connection, the more robust is the connection. As electrical interconnects become smaller and have larger numbers of contacts the small contact areas available for each connection fail to satisfy the requirements listed above.

SUMMARY

An electrical interconnect has an adhesive layer in which an array of apertures are formed, the apertures being of non-circular shape.

An electrical circuit apparatus has a first circuit having at least one electrical contact, a second circuit having at least one electrical contact aligned to the electrical contact of the first circuit, and a standoff structure between the first and second circuits having at least one aperture aligned to one electrical contact of the first and second circuits, the aperture being of a non-circular shape.

DETAILED DESCRIPTION

Figure 1:
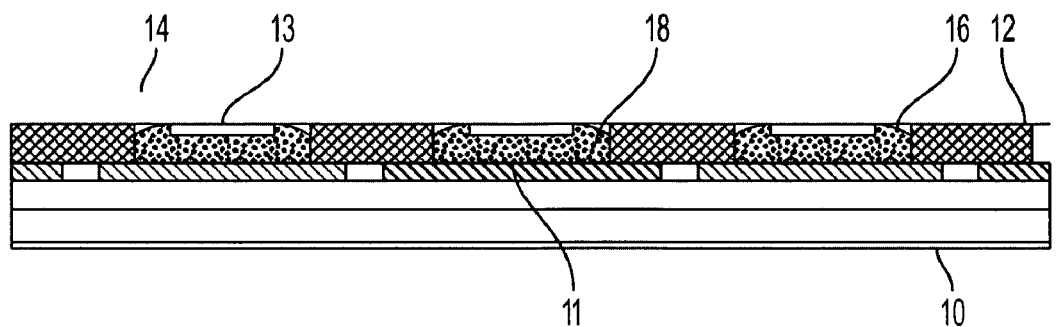
FIG. 1 shows a standoff positioned between two electrical circuits.

In FIG. 1, two electrical circuits are brought together in the electrical interconnect. The electrical interconnect may lie between a planar array of electromechanical transducers and a corresponding array of contact pads for each element in the transducer array. The contact pads may be on a flexible circuit or on a rigid circuit board. Electrical continuity between each element in the transducer array and each corresponding pad on the rigid or flexible circuit is accomplished with a conductive adhesive. An additional element in the interconnect is referred to herein as a "standoff". The standoff is an adhesive element having an array of openings that correspond to and align with the transducer array and array of contacts.

The contacts 11 on the first electrical circuit 10 are aligned with the apertures 16 on the standoff 12. The contacts 13 on the second electrical circuit 14 are then aligned with the apertures on the opposite of the standoff from the electrical circuit 10, and the two are joined together by some sort of conductive material 18.

Generally, the apertures in the standoff may be circular, as circular apertures follow conventional manufacturing approaches. The electrical contacts typically have a square, rectangular or other rhomboid shape. The mating of these geometries may result in a low surface area of contact. At lower densities, the apertures and contacts may have a larger size to alleviate this difficulty.

Figure 2:
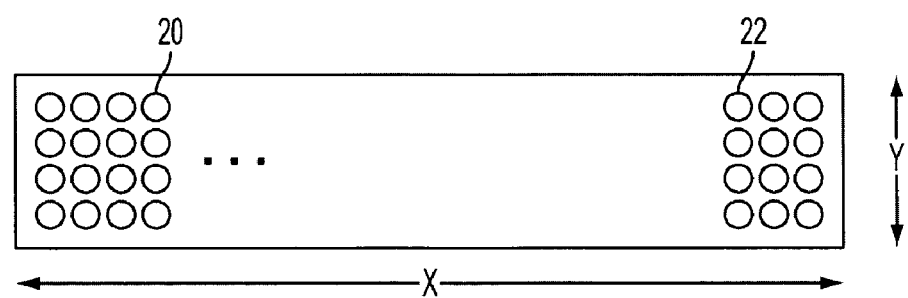
FIG. 2 shows arrays of apertures at different densities.

As the density of electrical circuits increase, the contacts and the apertures to connect those contacts become smaller within a same circuit size. For example, as shown in FIG. 2 a particular circuit has 880 contacts within a particular size connection area of X by Y resulting in contacts such as 20. At higher densities, the same size connection area X by Y may need to support 1236 contacts, shown by contacts such as 22. For example, rows may be added to the same circuit area. For some pad or transducer geometries, using a non-circular aperture allows the same density to be achieved, but with more surface area available for connection.

Figure 3:
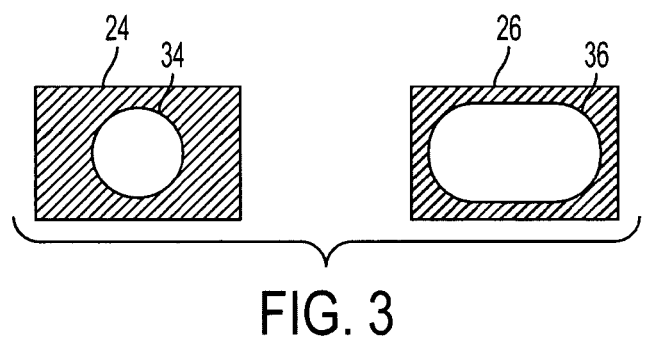
FIG. 3 shows different surface areas for differently shaped apertures.

As shown in FIG. 3, a close up of the matching surface area of a rhomboid contact 24 and the circular aperture such as 34 renders considerable surface area of the contact unusable as shown by the hatched area. In contrast, a non-circular aperture 26 matched to the rhomboid contact 36 results in a greater amount of usable surface area as shown by the clear area. Experiments have shown an increase of usable surface area of 83%. In one embodiment, the aperture was elliptical with an aspect ratio of 1.5:1.

Using a non-circular aperture in the standoff may provide a more robust connection. Current manufacturing processes generally use circular apertures due to the nature of the cutting process, but it is possible to manipulate the cutting process to form non-circular apertures such as elliptical apertures. These allow for a much higher utilization of the contact surface area for connection.

Figure 4:
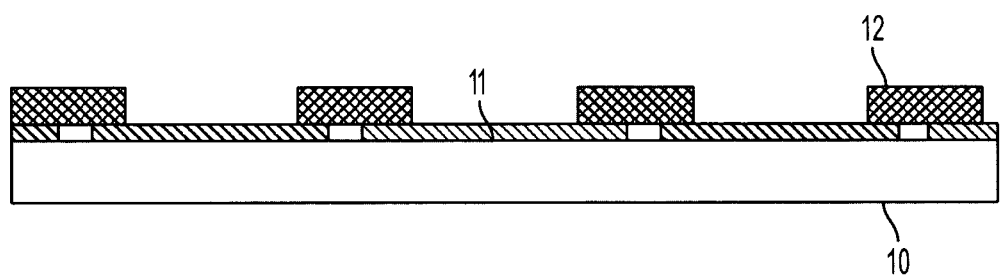
FIGS. 4-7 show a process of manufacturing an apparatus with a standoff.

An example of a method of forming an electrical interconnect is shown in FIGS. 4-7. In FIG. 4, the standoff 12, shown here as an adhesive material in which are formed an array of non-circular apertures 16, is applied to a first electrical circuit 10 having an array of electrical contacts such as 11 such that the apertures 16 are aligned with the contacts. The adhesive standoff may be acrylic, epoxy, phenolic, polyimide, silicone adhesive, a thermoset adhesive or a contact (pressure sensitive) adhesive. In addition, the adhesive standoff may be a laminate structure with adhesive on either side of a polymeric film. The laminate structure could be double-sided tape for example.

Applying the adhesive standoff may first involve manufacturing an array of apertures in the adhesive material. It is possible to manufacture the non-circular apertures 16 in the standoff 12 in many ways. They can be formed by laser cutting, drilling, punching or die cutting, as examples. Laser cutting of the apertures can be performed with galvanometer-scanned lasers such as $CO_2$ or diode-pumped solid state lasers. Alternatively, the cutting may be performed over extended arrays with an excimer laser using a contact or projection mask to pattern the apertures. The apertures, however manufactured, are then attached to the first electrical circuit. Alternative methods of producing the standoff element could include die cutting or casting over a mandrel.

Figure 5:
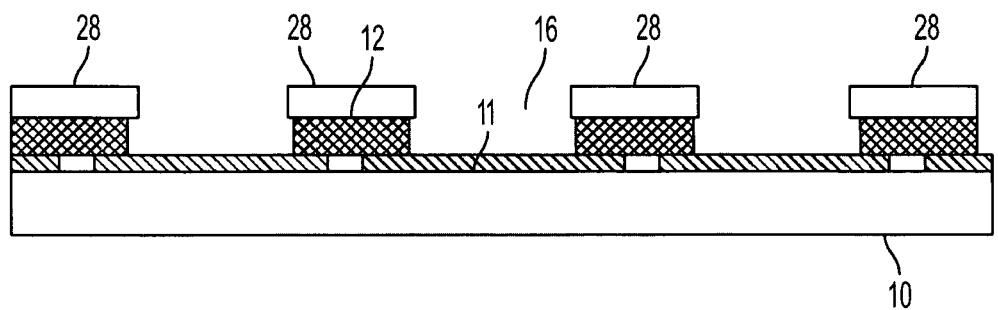
Figure 6:
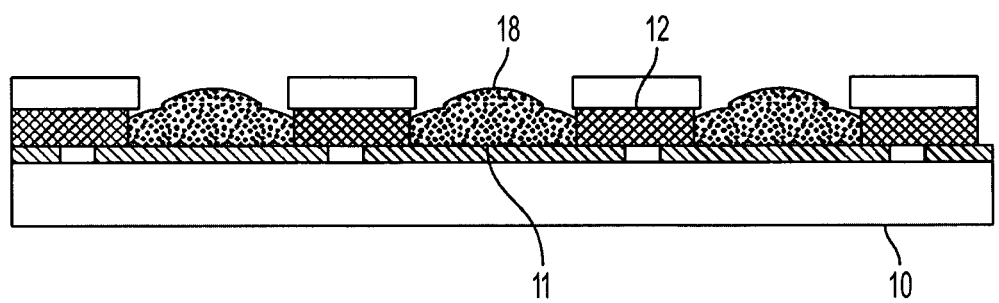

In FIG. 5, a stencil 28 is applied to the array of apertures to align holes in the stencil with the apertures. In FIG. 6, a layer of conductive material 18 is applied through the stencil 28 to the apertures. The stencil may have holes with a non-circular shape to aid in placing the desired amount of conductive material in the apertures. Applying the layer of conductive material may involve spreading the conductive material over the stencil such that the conductive material enters the apertures, as an example. Alternatively, epoxy could be dispensed into the individual apertures 16. The conductive material may be a conductive paste, silver epoxy, low melt solder paste such as any indium alloy powders suspended in a flux.

Figure 7:
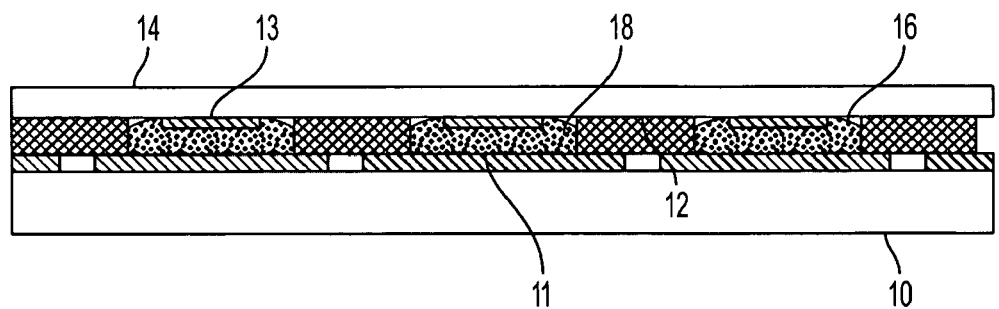

In FIG. 7, the stencil has been removed and the second electrical circuit 14 is attached. The second electrical circuit has a second array of contacts such as 13 that are aligned with the apertures 16 and then pressed or otherwise mated to the apertures filled with conductive material 18. The non-circular apertures of the standoff provide more surface area for the two sets of contacts to use in connection through the conductive material.

Figure 8:
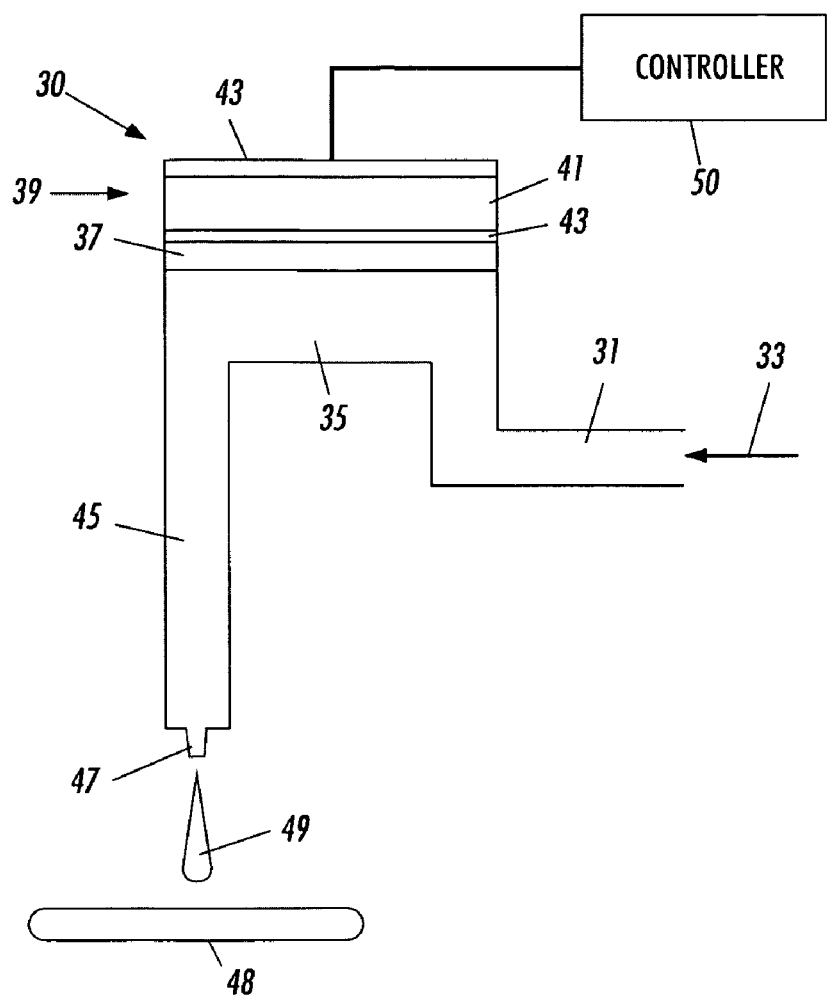
FIG. 8 shows a print head having a standoff.

Many different types of electronic devices may employ the resulting electrical structure. For example, a print head may attached to its printed circuit board, flexible cable or other electronic substrate that provides the control signals for operation of the print head. The first electrical circuit may be an actuator array that drives the individual jets of the print head, such as that shown in FIG. 8.

The first electrical circuit 10 in this example may be an array of transducers for an ink printer. The first electrical circuit 10 may comprise a piezoelectric actuator, for example. The piezoelectric actuator may have a piezo layer 41 between electrodes 43. The actuator, upon receiving a signal from the controller 50, would change dimensions and cause the diaphragm 37 to push downwards. Ink 33 taken from an ink reservoir or other source flows into the chamber 35 through the inlet 31. When the diaphragm pushed down, a drop of ink 49 pushed out the outlet 45 through a nozzle 47 onto a print medium 48.

The transducer receives the signal through the second electrical circuit 14 that is mated to the first electrical circuit 10 through the standoff 12, having apertures 16. In this example, it is this mating that benefits from the increase surface area of the connection. The above discussion is only intended as an example of a connection that may utilize the standoff with non-circular apertures. Having larger drops of conductive epoxy also provides more robustness to the assembly process to avoid either opens or shorts for some of the elements in the interconnect. No limitation of the claims is intended nor should be inferred.

The standoff serves two functions. The first is to confine the conductive adhesive to a small zone between the transducer and its corresponding pad for each element in the array. The second function of the standoff is to hold the transducer and contact arrays in close proximity and in a fixed spatial relationship, i.e., so that they do not move relative to one another. The standoff in the embodiments here has non-circular openings for some or all of the interconnects in the array to enable maximal contact area between non-circular transducers.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. An apparatus, further comprising:
a first circuit having an array of transducers, each transducer having a first electrical contact, the first electrical contact having one of a rectangular, square or rhomboid shape;
a print head having a diaphragm arranged adjacent the array of transducers, such that when a transducer receives a signal the transducer causes the diaphragm to deflect and push ink out of the print head;
a second circuit having an array of second electrical contacts, each second electrical contact aligned to the electrical contact of the first circuit, the second electrical contact having one of a rectangular, square or rhomboid shape;
a standoff structure between the first and second circuits having at least one aperture aligned to the at least one electrical contact of the first and second circuits, the aperture being of an elliptical shape; and
a controller electrically connected to the second circuit, the second circuit arranged such that signals from the controller are transmitted to the transducers through the apertures.

2. The apparatus of claim 1, the apparatus further comprising a conductive material in the aperture to form a connection between the electrical contacts of the first and second circuits.

3. The apparatus of claim 1, the conductive material further comprising one selected from the group consisting of: conductive paste, silver epoxy, low melt solder paste, and indium alloy powder suspended in a flux.

4. The apparatus of claim 1, the transducer further comprising a piezoelectric actuator.

5. The apparatus of claim 1, the second circuit further comprising a flexible circuit.

6. The apparatus of claim 1, the second circuit further comprising a printed circuit board.

* * * * *